(12) United States Patent
Amagai et al.

(10) Patent No.: US 6,232,661 B1
(45) Date of Patent: May 15, 2001

(54) SEMICONDUCTOR DEVICE IN BGA PACKAGE AND MANUFACTURING METHOD THEREOF

(75) Inventors: Masazumi Amagai, Oita; Norihito Umehara, Ibaraki; Kiyoshi Yajima, Oita, all of (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/352,109

(22) Filed: Jul. 14, 1999

(30) Foreign Application Priority Data

Jul. 14, 1998 (JP) .................................................. 10-198534

(51) Int. Cl.$^7$ .................................................. H01L 23/48
(52) U.S. Cl. .......................... 257/737; 257/738; 257/782; 257/783
(58) Field of Search .................................. 257/737, 738, 257/782, 783

(56) References Cited

U.S. PATENT DOCUMENTS 5,965,947 * 10/1999 Nam et al. ............................ 257/783
6,040,630 * 3/2000 Panchou et al. ..................... 257/783
6,081,038 * 6/2000 Murayama ........................... 257/783

OTHER PUBLICATIONS

"The Quality of Die–Attachment and Its Relationship to Stresses and Vertical Die–Cracking" Philips Research Lab. Sunnyvale; 0569–5503/83/0000–0237 1983 IEEE; van Kessel, C.G.M. et al; pp. 237–244.

"Thermal Stress in Bonded Joints" W. T. Chen, C. W. Nelson, IBM J. Res. Develop. vol. 23, No. 2, Mar. 1979; pp. 179–188.

"Failure Mechanisms for Epoxy Die Attach Adhesives in Plastic Encapsulated I.C.'s", Justin C. Bolger and Charles T. Mooney, Amicon, 0569–5503/83/0000–0227 IEEE, 1983; pp. 227–231.

"Polymide Adhesives to Reduce Thermal Stresses in LSI Ceramic Packages", Justin C. Bolger, 14th National SAMPE Technical Conference, Oct. 12–14, 1982; pp. 257–266.

* cited by examiner

*Primary Examiner*—David Mis
(74) *Attorney, Agent, or Firm*—William B. Kempler; Frederick J. Telecky, Jr.

(57) ABSTRACT

The purpose is to improve the assembly reliability of the BGA package. The present invention provides a type of BGA semiconductor device having plural conductor bumps arranged two-dimensionally on one surface of the insulating substrate. In this semiconductor device, there is adhesive layer (8) for attaching semiconductor chip (2) to said insulating substrate (3). According to the present invention, the outer edge of said adhesive layer (8) extends beyond the outer edge of said semiconductor chip (2). When the semiconductor device of the present invention is assembled on the external substrate, the stress forces that are caused by the difference in the linear expansion coefficient between semiconductor chip (2) and the external substrate and which propagate from the outer edge of the semiconductor chip to the joint of the conductor bumps located directly below the outer edge can be reduced by an adhesive layer (8) that extends beyond the outer side edge of said semiconductor chip (2), and the shear forces are reduced in the joint.

15 Claims, 2 Drawing Sheets

SEMICONDUCTOR DEVICE IN BGA PACKAGE AND MANUFACTURING METHOD THEREOF

FIELD OF THE INVENTION

The present invention pertains to a so-called BGA type semiconductor device. More specifically, the present invention pertains to a type of package structure of the semiconductor device preferred in improving the assembly reliability.

BACKGROUND OF THE INVENTION

The BGA (Ball Grid Array) semiconductor device is a type of semiconductor device having a surface assembly type package structure, in which plural ball-shaped solder pieces known as solder bumps are arranged two-dimensionally as the external connecting terminals. Since the connecting terminals can be arranged two-dimensionally, this type of package is preferred for high-density assembly. In particular, BGA has a very important position for the realization of CSP (Chip Size Package) semiconductor devices, that is, semiconductor devices having a package size that is nearly the same size or only slightly larger than the chip size, which have attracted much attention in recent years.

There are various types of BGA, such as the type in which a flexible insulating substrate made of polyimide resin or the like is used as the substrate of the package, and solder bumps are arranged two-dimensionally on one side of the flexible insulating substrate. In this type of semiconductor device, the semiconductor chip is attached to the flexible insulating substrate by an adhesive made of a nonconductive epoxy resin or the like and known as die attaching material. In the manufacturing process, an appropriate number of drops of the die attaching material is applied to the flexible insulating substrate; then, the semiconductor chip is pressed on the substrate, and the die attaching material spreads over the lower surface of the chip. After curing of the die attaching material by heating, necessary wiring is arranged and the semiconductor chip is sealed by a resin. For such a BGA type semiconductor device, assembly is carried out by melting the solder bumps as a whole by reflow after the semiconductor device is mounted on the external substrate (printed board for wiring) by a mounter.

High reliability during the assembly of the semiconductor device is very important. In particular, it has been noted that the assembly reliability is lower than that of the conventional QFP (Quad Flat Package) as explained below. In the temperature cycle test performed for the aforementioned BGA type semiconductor device, cracks may be generated in the joint between the flexible insulating substrate and the solder bumps, in particular, in the joint of the solder bumps right below the outer edge of the chip, and these can lead to the problem of openings in the device. The main cause is due to the difference in the linear expansion coefficient between the semiconductor chip and the external substrate, which generates a shear stress that is concentrated in the aforementioned joint. That is, since the modulus of elasticity of the die attaching material and the flexible insulating substrate between the chip and the external substrate is much lower than that of the chip and the external substrate, the shear stress generated due to the aforementioned difference in the linear expansion coefficient is concentrated in the solder joint. Since the influence of expansion of the semiconductor chip caused by heat is maximum at the edge, the shear stress is maximum in the joint of the solder bumps located right below it. Consequently, the stress in this portion rises, and the assembly reliability of the package is significantly affected.

The purpose of the present invention is to reduce the stress concentration in the joint between the flexible insulating substrate and the solder bumps located right below the outer edge of the semiconductor chip, to avoid the problem of openings (wire breakage) caused by cracks or the like in the joint, and thus to increase the assembly reliability.

Another purpose of the present invention is to improve the assembly reliability of the package without changing the basic shape of the aforementioned package, without a significant change in the manufacturing process and without increasing the manufacturing cost.

SUMMARY OF THE INVENTION

The present invention provides a type of semiconductor device characterized by a semiconductor chip, a flexible insulating substrate which has a first surface and a second surface and which has a conductor pattern on at least one of the surfaces, plural conductor bumps which are arranged two-dimensionally on the first surface of the aforementioned flexible insulating substrate and which electrically connect the aforementioned conductor pattern to an external substrate, and an adhesive layer which is set between the aforementioned flexible insulating substrate and the aforementioned semiconductor chip for attaching the aforementioned semiconductor chip on the second surface of the aforementioned flexible insulating substrate. According to the present invention, the outer edge of the aforementioned adhesive layer extends over the outer edge of the aforementioned semiconductor chip. When the semiconductor device of the present invention is assembled on the external substrate, stress forces, which are caused by a difference in the linear expansion coefficient between the semiconductor chip and the external substrate, and which propagates from the outer edge of the semiconductor chip to the joint of the conductor bumps, is reduced by the adhesive layer extending outward from the aforementioned semiconductor chip, so that shear forces at the joint are reduced.

According to the present invention, in order to reduce the influence of the aforementioned stress forces on all of the conductor bumps located outside the outer edge of the semiconductor chip, it is preferred that the aforementioned adhesive layer extends beyond the area where the aforementioned conductor bumps are located on the aforementioned flexible insulating substrate.

Also, in the present invention, the thickness of the aforementioned adhesive layer is preferably 100 $\mu$m or larger.

Also, in the present invention, it is preferred that the aforementioned adhesive layer has a linear expansion coefficient nearly equal to the linear expansion coefficient of the external substrate on which the aforementioned semiconductor device is assembled.

In this case, for the aforementioned adhesive layer, it is preferred that an adhesive is applied on both sides of an intermediate member which has a linear expansion coefficient nearly equal to the linear expansion coefficient of the external substrate on which the aforementioned semiconductor device is assembled.

Also, in the present invention, it is preferred that the modulus of elasticity of the aforementioned adhesive layer be 10 kg/mm$^2$ or higher.

Also, the present invention discloses a manufacturing method of a semiconductor device characterized by the fact that it comprises the following steps: a step in which a semiconductor chip is formed; a step that forms a flexible insulating substrate, which has a first surface and a second surface and which has a conductor pattern on one of the surfaces and conductor bumps attached to the first surface; a step in which a film material made of a resin, which is coated on both sides with an adhesive and has a planar size larger than the planar size of the aforementioned semiconductor chip, is bonded to the second surface of the aforementioned flexible insulating substrate; a step in which the aforementioned semiconductor chip is mounted on the aforementioned resin film material so that the aforementioned semiconductor chip bonds to the aforementioned resin film material; a step in which the aforementioned semiconductor chip is electrically connected to the conductor pattern on the aforementioned flexible insulating substrate; a step in which the aforementioned semiconductor chip is sealed; and a step in which the aforementioned conductor bumps are electrically connected to the aforementioned conductor pattern on the first surface of the aforementioned flexible insulating substrate.

REFERENCE NUMERALS AND SYMBOLS AS SHOWN IN THE DRAWINGS

Figure 1:
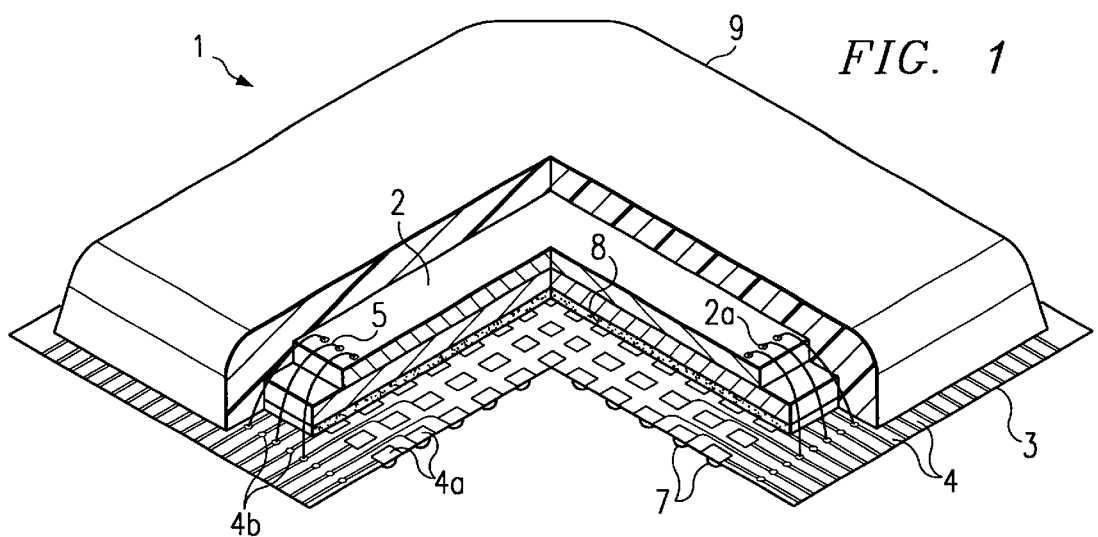
FIG. 1 is an oblique view of a portion of the semiconductor device having a CSP type package on which the present invention is applied.

1. Semiconductor device
2. Semiconductor chip
2a Electrode pad
3 Insulating substrate
3a Via hole
4 Copper pattern
4a Bump connecting land
4b Wire connecting land
5 Conductor wire
6 Solder resist
7 Solder bump
8 Die attaching tape
9 Molding resin

DESCRIPTION OF EMBODIMENTS

Figure 4A:
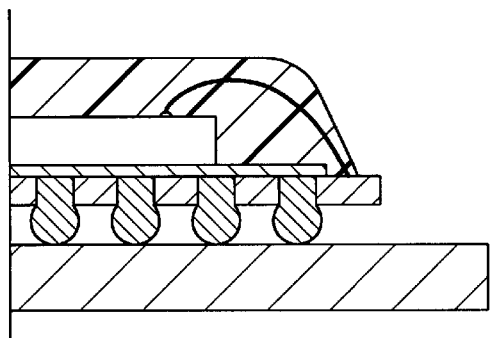
FIG. 4A is a schematic cross-sectional view of the semiconductor device in an embodiment of the present invention.
Figure 4B:
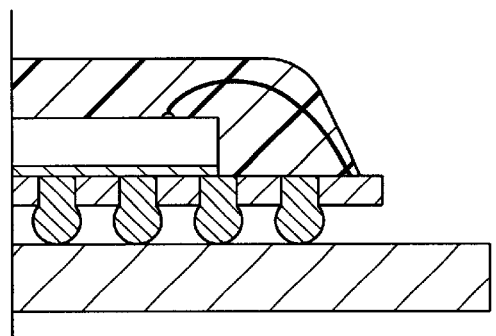
FIG. 4B is a conventional semiconductor device, both used to measure the defective rate.

For the semiconductor device in an embodiment of the present invention shown in FIG. 4(A) (referred to as the embodiment below) and the semiconductor device having the conventional structure shown in FIG. 4(B) (referred to as the conventional semiconductor device below), measurement was made on the defective rate in the temperature cycle test. The measurement conditions were as follows.

Temperature cycle condition: −40 to 125° C. (20 min in each cycle/9 min for maintaining the temperature, and 1 min for heating/cooling)

Package size: 12×12 mm

Chip size: 8.5×8.5 mm

Solder bumps: 144 bumps of 63/37 eutectic solder (0.5 mm in diameter) are arranged with a pitch of 0.8 mm Die attaching tape: Outside dimensions of 10×10 mm External substrate material: glass cloth reinforced epoxy resin (FR-4), thickness of 0.8 mm Under the above listed conditions, a simulation was performed for a defective rate from 1% to 5%. The measurement was carried out for two types having different values of the distance between the solder bumps and the inner surface of the semiconductor chip, that is, the sum thickness of the die attaching tape and the insulating substrate (or, chip-bump distance in the table). The results are listed in Table 1.

TABLE 1

| | Number of temperature cycles to reach each defective rate | | | |
|---|---|---|---|---|
| | Embodiment | | Prior art example | |
| Chip-bump distance ($\mu$m) | Defective rate of 1% | Defective rate of 5% | Defective rate of 1% | Defective rate of 5% |
| 115 | 890 | 1094 | 812 | 997 |
| 190 | 1100 | 1352 | 916 | 1126 |

From the aforementioned results, it can be concluded that for any of the different chip-bump distance values, the number of the temperature cycles to reach the prescribed defective rate is large in the embodiment. That is, the assembly reliability of package is high in the embodiment.

In the above, an explanation has been given for the embodiment of the present invention with reference to figures. However, it is clear that the application range of the present invention is not limited to the items disclosed in the aforementioned embodiment. In the conventional case, the die attaching material is used only as a part for attaching the semiconductor chip to the insulating substrate. Now, in the present invention, a characteristic feature is that by extending the die attaching material to the region not related to its intrinsic purpose, that is, the region outside the outer edge of the semiconductor chip, it is possible to reduce the stress concentration in the joint of the solder bumps. Consequently, according to the present invention, there is no limitation to the aforementioned embodiment with respect to the shape of the package, the pattern of the conductor leads, the number and configuration of the solder bumps, and the materials for these parts.

As explained above, in the BGA package, the possibility of openings due to thermal stress most likely takes place in the solder bumps located right below the semiconductor chip. Consequently, the die attaching tape may be arranged so that it extends beyond the area of the solder bumps directly below it, or, as illustrated in the embodiment, it may be arranged so that it covers the entire area of all of the solder bumps. Also, in the aforementioned embodiment, the copper pattern is formed on the chip-carrying side of the insulating substrate. However, it is also possible to apply the present invention to a semiconductor device in which the copper pattern is set on the opposite side, that is, the lower side, of the insulating substrate, as shown in the figure.

According to the present invention, in the temperature cycle test, it is possible to reduce the stress concentration in the joint with the solder bumps, in particular, the joint of the solder bumps positioned outside the semiconductor chip where the chance of openings is the highest, and it is thus possible to reduce the assembly defective rate and to increase the assembly reliability of the BGA package.

Also, according to the present invention, it is possible to improve the assembly reliability of the package without changing the basic shape of the package, without significant change in the manufacturing process, and without increasing the manufacturing cost.

Figure 2:
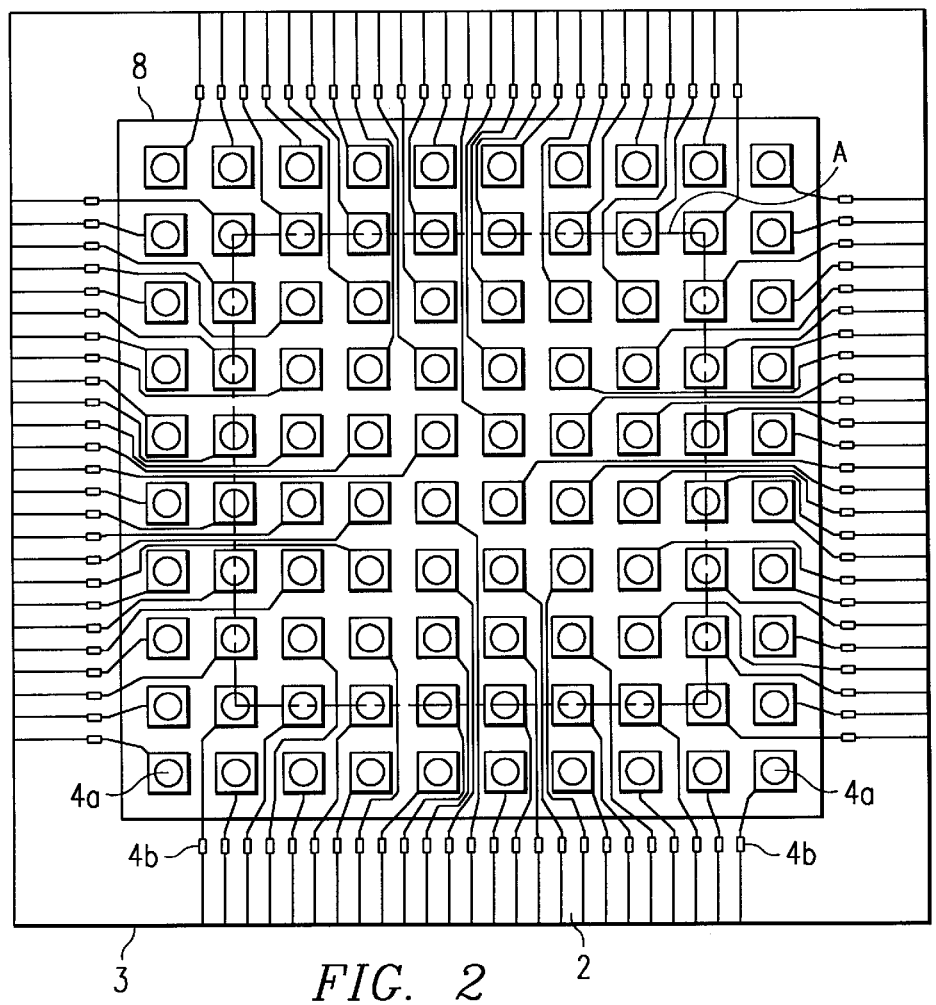
FIG. 2 is a cross-sectional view of the semiconductor device shown in FIG. 1.
Figure 3:
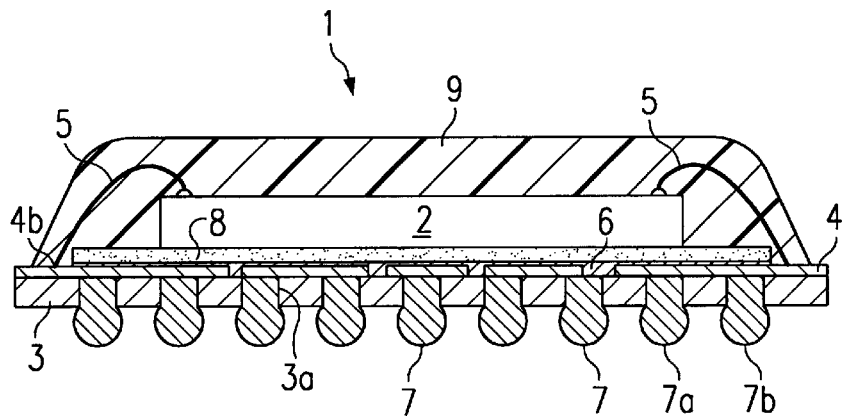
FIG. 3 is a plan view of the insulating substrate used in the semiconductor device shown in FIG. 1.

In the following, the embodiment of the present invention will be explained with reference to figures. FIGS. 1 and 2 are exterior oblique views of a portion of semiconductor device 1. FIG. 3 is its cross-sectional view. Semiconductor device 1 shown in these figures is the default for the following explanation. One should notice that practical dimensions and shapes can differ from the presented device.

Semiconductor device 1 has insulating substrate 3 which has a planar size that is larger than that of semiconductor chip 2 by a certain margin. As an embodiment, insulating substrate 3 is a film piece made of straight-chain nonthermoplastic polyimide measuring 12 mm square and 75 $\mu$m in thickness. On the surface of insulating substrate 3, plural pieces of copper pattern 4 are formed for electrically connecting semiconductor chip 2 to solder bumps 7 as the external connecting terminals. Said copper pattern 4 is formed by bonding a copper foil on the surface of insulating substrate 3 by means of an adhesive layer, followed by etching the undesired portions. Also, it is possible to form copper pattern 4 on insulating substrate 3 by means of sputtering. For each piece of copper pattern 4, one end is positioned on via hole 3a formed on insulating substrate 3, and then connected to solder bump 7 through said via hole 3a. In the following, this region is referred to as bump connecting land 4a. Bump connecting lands 4a of the various pieces of copper pattern are arranged in a two-dimensional configuration on insulating substrate 3 corresponding to the positions of said via holes 3a, respectively.

The other end of each piece of copper pattern 4 extends towards the outside of said insulating substrate 3 and reaches the end of the insulating substrate. On the inner side of copper pattern 4 from the end, region 4b having a width larger than the line width of the pattern is formed. One end of conductor wire 5 extending from electrode pad 2a formed on the circuit forming surface side of semiconductor chip 2 is connected to this region having a relatively large width. In the following, this region is referred to as wire connecting land 4b. In the embodiment, the line width of copper pattern 4 is about 0.035 mm, the width of bump connecting land 4a is about 0.47 mm, and the width of the wire connecting land 4b is about 0.1 mm. Also, the pitch of the adjacent bump connecting lands 4a is about 0.8 mm.

As shown in FIG. 2, solder resist 6 made of an epoxy-based resin is coated over the entire surface of insulating substrate 3 on which said copper pattern 4 is formed. In order to bond conductor wire 5, the solder resist on wire connecting land 4b of the copper pattern is removed.

Semiconductor chip 2 is bonded on insulating substrate 3 by means of the adhesive layer set on solder resist 6, that is, die attaching tape 8. Then, the chip is sealed by the transfer molding method using molding resin 9 after bonding of conductor wire 5. Die attaching tape 8 can be prepared by using a mold to cut the die attaching sheet made of epoxy resin, polyimide resin, polyamide resin or other resin supplied in tape form. Also, one may make use of a thermoplastic polyimide resin. In this case, die attaching tape 8 has a size that can cover the region on insulating substrate 3 where said connecting lands 4a are set. That is, the outer edge of die attaching tape 8 extends over the outer edge of semiconductor chip 2.

The region of die attaching tape 8 which extends beyond semiconductor chip 2 acts to improve the assembly reliability against the thermal stress when semiconductor device 1 is assembled on, say, the external substrate made of glass-cloth-reinforced epoxy resin substrate FR-4. That is, due to the difference in the linear expansion coefficient between the external substrate and semiconductor chip 1, stress forces from semiconductor chip 1 towards the external substrate are generated. The portion most affected by the influence of contraction of the thermal stress is the outer edge of semiconductor chip 1, and the stress forces from this portion are the maximum. The region of die attaching tape 8 that is beyond said semiconductor chip 1 is positioned between the outermost 2 which is where columns of solder bumps 7a and 7b and the outer edge of semiconductor chip 1, the maximum stress forces are generated, and this region absorbs a portion of the aforementioned stress forces on older bumps 7a and 7b generated by the aforementioned difference in the linear expansion coefficient. As a result, the shear energy used by the stress forces transferred to solder bumps 7a and 7b are reduced.

Also, die attaching tape 8 has a thickness that is larger than the thickness (15–30 $\mu$m) needed for attaching semiconductor chip 2. In an embodiment, the thickness of die attaching tape 8 is 125 $\mu$m. Die attaching tape 8 with sufficient thickness acts to further reduce the influence of the stress forces on said solder bumps 7a and 7b.

In this case, for said die attaching tape 8, a three-layer laminated structure prepared by applying an adhesive on both sides of an intermediate member having a linear expansion coefficient nearly equal to the linear expansion coefficient of the external substrate may be adopted. The intermediate member may be made of gold, copper, silver, aluminum, iron, nickel, or another metal, or their alloy, or a laminate of several layers of these metals or alloys. Also, one may use an insulating base material mainly made of an organic resin, such as phenol resin, polyester resin, epoxy resin, glass epoxy resin, polyimide resin, polysulfone resin, polyether sulfone resin, polyphenylene sulfide resin, polyethylene naphthalate, etc. When the intermediate member is made of a metal, die attaching tape 8 has a linear expansion coefficient of about 3–30 ppm/° C. and a modulus of elasticity of 1,000–20,000 kg/mm$^2$. When the intermediate member is made of an organic material, the linear expansion coefficient is about 10–100 ppm/° C. and the modulus is 200–2,000 kg/mm$^2$. Also, it is possible to use a B-stage epoxy based resin, thermoplastic polyimide, etc. as the aforementioned adhesive.

Also, for die attaching tape 8, in addition to the requirement that its linear expansion coefficient is nearly equal to that of the external substrate, it is preferred that it have a high modulus of elasticity of 10 kg/mm$^2$ or higher. When the modulus of elasticity of the die attaching tape is high, the distortion stress generated in the temperature cycle test is dispersed over the interface between the inner surface of the semiconductor chip and the die attaching tape, and the stress concentration in the joint of the solder bumps is reduced. Also, when the modulus of elasticity of the die attaching tape is lower than 10 kg/mm$^2$, it is hard to perform wire bonding.

FIG. 2 is a plan view of insulating substrate 3. In this figure, the planar size of said die attaching tape 8 with respect to semiconductor chip 2 and insulating substrate 3 is clearly illustrated. Bump connecting lands 4a of copper pattern 4 are set in a 2-dimensional configuration, and die attaching tape 8 is arranged such that it covers all of bump connecting lands 4a. In the figure, hatched region A indicates the assembly position of semiconductor chip 2. Attention should be paid to the fact that while the outer edge of semiconductor chip 2 is located between the two outermost columns of bump connecting lands 4a, the outer edge of die attaching tape 8 covers and extends beyond this outer edge of the chip.

What is claimed is:

1. Semiconductor device comprising:

a semiconductor chip, a flexible insulating substrate which has a first surface and a second surface and which has a conductor pattern on at least one of the surfaces, plural conductor bumps which are arranged two-dimensionally on the first surface of flexible insulating substrate and which electrically connect the conductor pattern to an external substrate, and an adhesive layer which is set between the flexible insulating substrate and the semiconductor chip for attaching the semiconductor chip on the second surface of the flexible insulating substrate, said adhesive layer being continuous from an outer edge at one side of said chip to an outer edge at an opposite side of said chip, said outer edges extending beyond the area where the conductor bumps are set on the flexible insulating substrate for spreading thermal stresses beyond said conductor bumps.

2. The semiconductor device described in claim 1 wherein the thickness of the adhesive layer is 100 $\mu$m or larger.

3. The semiconductor device described in claim 1 wherein the adhesive layer has a linear expansion coefficient nearly equal to the linear expansion coefficient of the external substrate on which the semiconductor device is assembled.

4. The semiconductor device described in claim 3 wherein the adhesive layer has adhesive applied on both sides of an intermediate member which has a linear expansion coefficient nearly equal to the linear expansion coefficient of the external substrate on which the semiconductor device is assembled.

5. The semiconductor device described in claim 1 wherein the adhesive layer has a modulus of elasticity of 10 kg/mm$^2$ or higher.

6. The semiconductor device described in claim 1 wherein the flexible insulating substrate has the conductor pattern on the second surface, and, at the same time, it has via holes at the sites corresponding to the conductor bumps; through these via holes, connection is made between the conductor pattern and the conductor bumps.

7. The semiconductor device described in claim 6 wherein a portion of the conductor pattern extends over the outer edge of the adhesive layer, and electrical connection is made between a portion of the conductor pattern and the semiconductor chip by means of conductor wires.

8. The semiconductor device described in claim 7 wherein on the second surface of the flexible insulating substrate, there is a sealing material which seals the semiconductor chip, the adhesive layer, the conductor pattern, and the conductor wires.

9. The semiconductor device described in claim 2 wherein the adhesive layer is 100 $\mu$m or larger.

10. The semiconductor device described in claim 2 wherein the adhesive layer has a linear expansion coefficient nearly equal to the linear expansion coefficient of the external substrate on which the semiconductor device is assembled.

11. The semiconductor device described in claim 2 wherein the adhesive layer has a linear expansion coefficient nearly equal to the linear expansion coefficient of the external substrate on which the semiconductor device is assembled.

12. The semiconductor device described in claim 2 wherein the adhesive layer has a modulus of elasticity of 10 kg/mm$^2$ or higher.

13. The semiconductor device described in claim 2 wherein the adhesive layer has a modulus of elasticity of 10 kg/mm$^2$ or higher.

14. The semiconductor device described in claim 2 wherein the flexible insulating substrate has the conductor pattern on the second surface, and, at the same time, it has via holes at the sites corresponding to the conductor bumps; through these via holes, connection is made between the conductor pattern and the conductor bumps.

15. Manufacturing method of a semiconductor device comprising the following steps:

forming a semiconductor chip;

forming a flexible insulating substrate, which has a first surface and a second surface and which has a conductor pattern on one of the surfaces and conductor bumps attached to the first surface;

bonding a film material made of a resin, which is coated on both sides with an adhesive, the film having a planar size larger than the planar size of the semiconductor chip, to the second surface of the flexible insulating substrate;

mounting the semiconductor chip on the resin film material so that the semiconductor chip bonds to the resin film material;

electrically connecting the semiconductor chip to the conductor pattern on the flexible insulating substrate;

sealing the semiconductor chip;

electrically connecting the conductor bumps to the conductor pattern on the first surface of the flexible insulating substrate.

* * * * *